(12) United States Patent
Garabedian et al.

(10) Patent No.: US 7,692,436 B2
(45) Date of Patent: Apr. 6, 2010

(54) PROBE CARD SUBSTRATE WITH BONDED VIA

(75) Inventors: Raffi Garabedian, Monrovia, CA (US); Salleh Ismail, Moorpark, CA (US); Lakshmikanth Namburi, Duarte, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 12/077,627

(22) Filed: Mar. 20, 2008

(65) Prior Publication Data

US 2009/0237099 A1    Sep. 24, 2009

(51) Int. Cl.
*G01R 31/02* (2006.01)
(52) U.S. Cl. .................. 324/754; 324/761; 324/762
(58) Field of Classification Search .................. None
See application file for complete search history.

(56) References Cited

U.S. PATENT DOCUMENTS

| 5,090,118 | A | * | 2/1992 | Kwon et al. ................. 29/843 |
| 6,838,893 | B2 | * | 1/2005 | Khandros et al. ........... 324/754 |
| 2006/0040417 | A1 | * | 2/2006 | Eldridge et al. .............. 438/14 |
| 2008/0246501 | A1 | * | 10/2008 | Williams et al. ............ 324/762 |

* cited by examiner

*Primary Examiner*—Minh N Tang
(74) *Attorney, Agent, or Firm*—Holland & Hart, LLP

(57) ABSTRACT

The present invention is directed to a probe head having a probe contactor substrate with at least one slot that passes through the probe contactor substrate, at least one probe contactor adapted to test a device under test, with the probe contactor being coupled to the a top side of the probe contactor substrate and electrically connected to a terminal also disposed on top of the probe contactor substrate, and a space transformer having at least one bond pad coupled to a top side of the space transformer, and a bond interconnect which electrically couples the bond pad to the terminal through the slot in the probe contactor substrate.

19 Claims, 15 Drawing Sheets

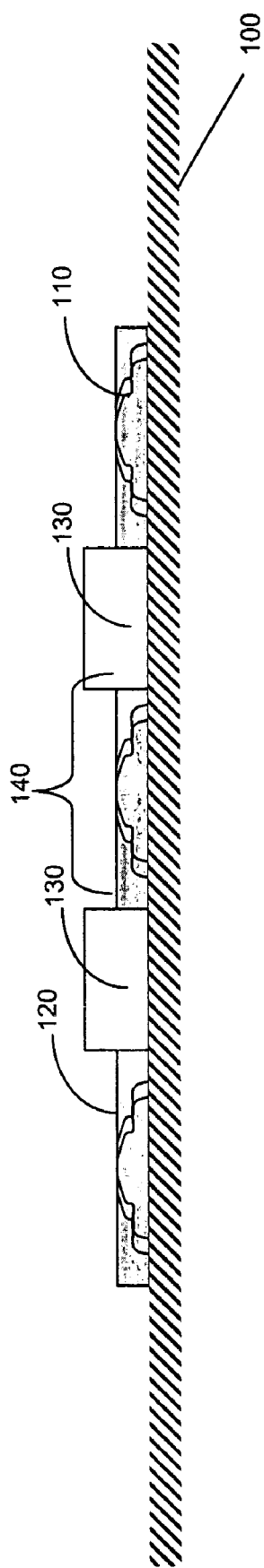
Fig. 3
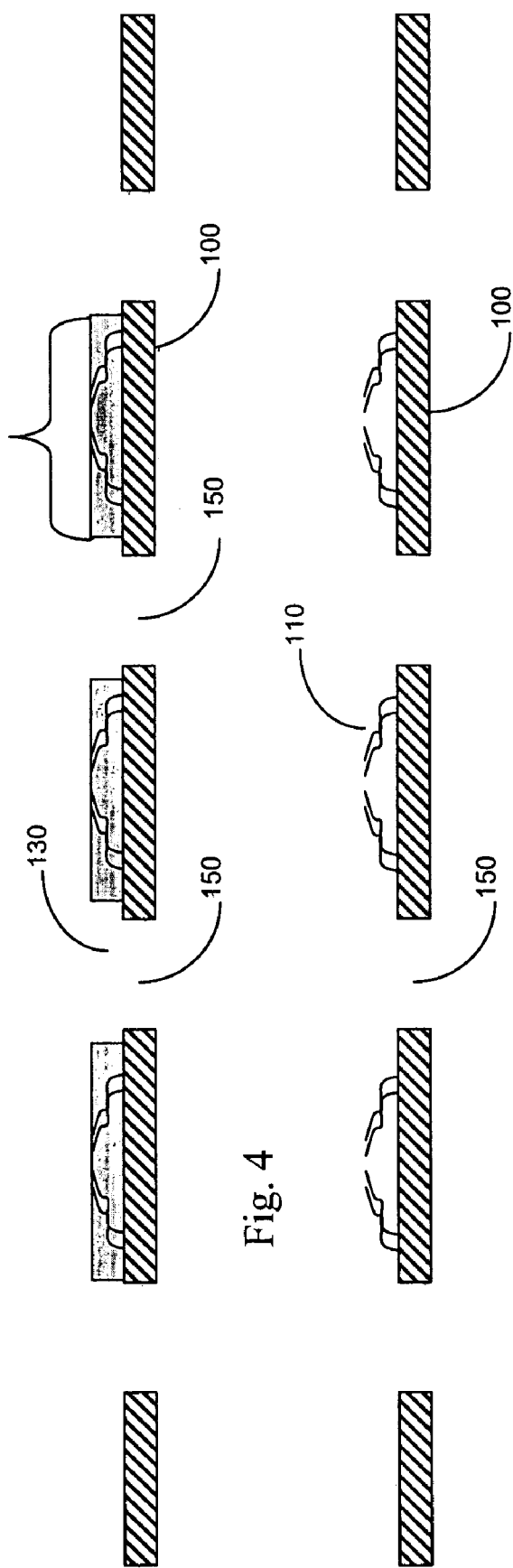
Fig. 4
Fig. 5

Bonded Via Detail

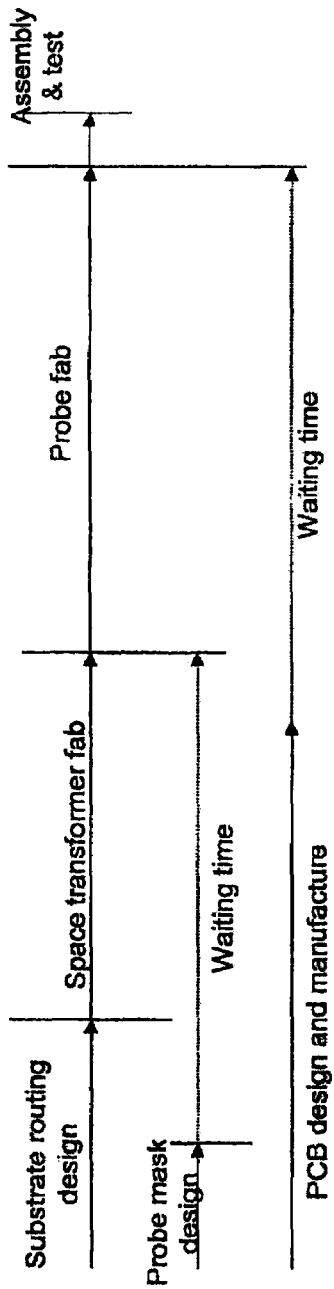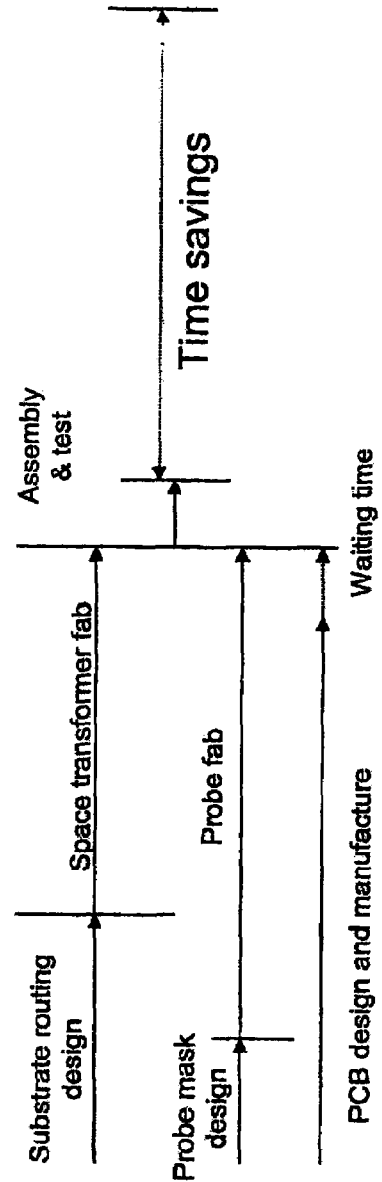
Fig. 12
--Prior Art--
Fig. 13

PROBE CARD SUBSTRATE WITH BONDED VIA

BACKGROUND

The present invention relates generally to the testing of semiconductor chips, and specifically to the design of an interconnect mechanism for use in probe card assemblies.

Typically, semiconductor chips are tested to verify that they function appropriately and reliably. This is often done when the semiconductor chips are still in wafer form, that is, before they are diced from the wafer and packaged. This allows the simultaneous testing of many semiconductor chips at a single time, creating considerable advantages in cost and process time compared to testing individual chips once they are packaged. If chips are found to be defective, they may be discarded when the chips are diced from the wafer, and only the reliable chips are packaged. They may also be tested after dicing but before packaging by assembling die on tape or a mechanical carrier.

Generally, modern microfabricated (termed MEMS) probe card assemblies for testing semiconductors have at least three components: a printed circuit board (PCB), a substrate to which thousands of probe contactors are coupled (this substrate hereinafter will be referred to as the "probe contactor substrate"), and a connector (often called an "interposer") which electrically interconnects the individual electrical contacts of the PCB to the corresponding electrical contacts on the probe contactor substrate which relays signals to the individual probe contactors. The combination of the probe contactor substrate and the coupled contactors is sometimes referred to as the Probe Head. The probe contactors on the probe contactor substrate often have a very fine pitch (distance between the contactors) (30 um to 200 um) while the electrical contacts of the PCB and the interposer often have coarser pitches (>200 um). Thus, in modern MEMS probe card assemblies, the probe contactor substrate is often referred to as a space transformer as the substrate spreads out the electrical connections from the fine pitch of the electrical connections of the probe contactors to the coarser pitch found on the interposer and PCB. It should be noted that some probe cards do not utilize an interposer, but the general idea is unchanged. In most applications, the PCB and the probe head must be roughly parallel and in close proximity, and the required number of interconnects contained in the space transformer may be in the thousands or tens of thousands. The vertical space between the PCB and the probe contactor substrate is generally constrained to a few millimeters by the customary design of the probe card assembly and the associated semiconductor test equipment. It is also important that the contact tips of the probe head lie essentially in a plane. The background of U.S. Pat. No. 7,180,316, titled "Probe Head with Machined Mounting Pads and Method of Forming Same," assigned to Touchdown Technologies, Inc. of Baldwin Park, Calif., discusses the importance of the planarity of the probe tips.

There are several ways of manufacturing a finished probe card assembly. A typical approach is shown in FIG. 12. This involves a series of critical time intensive steps which include, designing the electrical interconnect routing for the space transformer, designing the layout for the probe contactors (which may be lithographically fabricated), fabricating the space transformer, and then building or assembling the probe contactors onto the space transformer. However, this serial approach greatly increases the time required to manufacture a finished probe card assembly. Manufacturing the space transformer and the probe contactors are typically the most time consuming steps which is several weeks. A process whereby the manufacture of the probe contactors onto a substrate and the manufacture of the space transformer may be done simultaneously would result in significant savings of both time and cost.

Additionally, in the current form of manufacturing MEMS formed probe contactors, the space transformer substrate upon which the probe contactors are formed is an LTCC (Low-Temperature Co-fired Ceramic), HTCC (High-Temperature Co-fired Ceramic), or thin-film high-density interconnect (HDI) substrate that allows for easy fabrication of vias (interconnections that allow electrical signals to pass from the top of the substrate to the bottom of the substrate) while redistributing the interconnections from the fine pitch necessary for the probe contactors to the coarser pitch needed by the interposer and PCB. These substrates are commonly used because they provide a compromise between providing the redistribution capability needed of the space transformer on the one hand and the mechanical strength, thermal properties, and construction elements needed for MEMS fabrication in the final assembly on the other hand.

However, LTCC/HTCC substrates are not the ideal substrates for MEMS manufacturing. They neither offer the optimum surface quality nor the optimum strength required for forming MEMS probe contactors on a substrate. To overcome these issues, certain undesirable features must be included in the LTCC/HTCC substrates. The issue of strength is usually overcome by using very thick LTCC/HTCC substrates and the issue of surface quality is overcome by further modifying the substrate with lapping/polishing or with coatings such as polyimide. All of these steps add complexity and time to the fabrication process. Additionally, substrates other than LTCC/HTCC are better suited for via redistribution, the primary function of the space transformer, however they lack the strength, thermal properties, or compatibility for MEMS manufacturing. In other words, LTCC/HTCC or thin-film HDI substrates are a compromise material for probe card substrates and space transformers. Thus, what is needed is a manufacturing process that will allow for the simultaneous, or parallel, fabrication of the probe contactor substrate and the space transformer, and that further allows for greater choice in selecting the material that forms the probe contactor substrate and the space transformer substrate.

SUMMARY OF THE INVENTION

Embodiments of the present invention are directed to a probe card assembly utilizing a single probe contactor substrate, or a plurality of probe contactor substrates, having a plurality of openings (holes 1100, or in many cases slots, including vertical slots 1110 and horizontal slots 1120) cut entirely through the probe contactor substrate and that run longitudinally/laterally and that vary in size and shape as shown in FIG. 11. The individual probe contactors are connected to terminals using wire bonds (the terminals are usually gold pads but other structures are commonly known in the art of wire bonding) on the space transformer through the slots in the probe contactor substrate. Because the probe contactor substrate and space transformer are separate substrates, the space transformer can be manufactured at the same time the probe head (the probe contactor substrate with the contactors attached) is being manufactured. A manufacturing timeline for such a process is shown in FIG. 13, and when compared to the traditional manufacturing process shown in FIG. 12, significant time savings are realized. Additionally, because the probe contactor substrate is not the space transformer and thus, does not need to be punched, printed, and co-fired as in the prior art, the probe contactor substrate and space transformer may be formed of different materials having more desirable qualities for their respective functions.

Embodiments of the present invention generally include a probe head which incorporates a probe contactor substrate along with the probe contactors which will contact the device(s) under test (DUT). The probe contactor substrate is a single substrate through which slots (vertical slots 1110 or horizontal slots 1120) or holes 1100 are formed (as opposed to multiple separate substrates, sometimes referred to as "tiled substrates"). Upon the upper surface of the substrate, the probe contactors are formed, preferably using a lithographic process such as those described by U.S. patent application Ser. Nos. 11/019,912, 11/102,982, 11/194,801, and 11/194,720, all of which are assigned to Touchdown Technologies, Inc., and the disclosures of which are hereby incorporated by reference. Each of the probe contactors has an associated terminal (also known as a "bond pad") which is a metal terminal connected to the probe contactor by means of a conductive metal trace.

While the probe head is being manufactured, the space transformer may also be manufactured. The space transformer is generally a Low Temperature Co-fired Ceramic (LTCC) or another material that is primarily selected for multi-layer wiring capability, cost, and manufacturability. In addition to a LTCC substrate, a High Temperature Co-fired Ceramic (HTCC), an organic laminate substrate, or a multi-layer substrate with High Density Interconnect (HDI) may also be used as the space transformer. The space transformer includes terminals or bond pads on its top surface. The bond pads are electrically connected to vias that extend through the space transformer which will electrically connect the space transformer to the PCB. The bond pads on the space transformer are aligned in rows that match the slots cut in the probe contactor substrate. Bond pads may also be aligned with selected holes which are formed in the probe contactor substrate as shown in FIG. 11.

Once the probe head and space transformer have been manufactured the probe contactor substrate is attached to the space transformer using an epoxy or adhesive polymers (or any other suitable adhesive means including solder or brazing, or using mechanical means such as screws or fasteners or spring clips) such that the bond pads on the space transformer are accessible through the slots in the probe contactor substrate. The bond pads on the space transformer are then electrically connected to the terminals on the probe contactor substrate.

BRIEF DESCRIPTION OF THE DRAWINGS

FIGS. 1-8 illustrate a process for forming an embodiment of the present invention.

FIG. 12 illustrates a timeline for typical probe card manufacturing.

FIG. 13 illustrates a timeline for manufacturing of the present invention.

DETAILED DESCRIPTION

Figure 1:
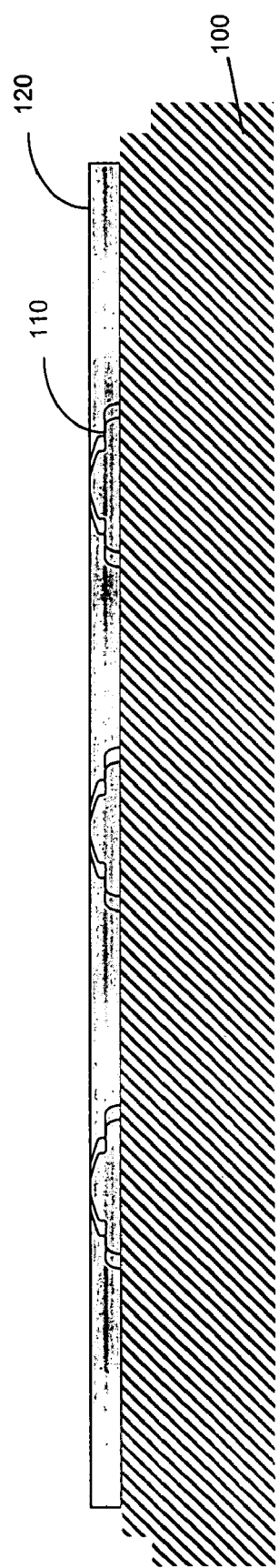

FIGS. 1-8 illustrate a process for forming an embodiment of the present invention. As shown in FIG. 1, a probe contactor substrate 100 is chosen. Because of the unique way in which the probe card assembly is fashioned, the probe contactor substrate 100 is not limited to materials generally used as probe contactor substrates, namely LTCC, HTCC, ceramics with vias, or multi-layer HDI substrates. Because the probe contactor substrate does not require electrical vias through the substrate, the substrate may be any suitable material. In an embodiment of the present invention the probe contactor substrate 100 is an alumina ceramic substrate. When used to test semiconductors, generally the probe contactor substrate should exhibit qualities such as good thermal expansion matching that of silicon (because the device under test is usually silicon), good surface quality (low pitting, excellent planarity and surface roughness), good electrical properties for high frequency signal transmission through conductors built on its surface (implies the need for a low-loss dielectric substrate material), good mechanical strength and processability (ability to form holes or slots conveniently and to build wiring traces on the surface). Alumina ceramic (95%-99% alumina) is a preferred material as it meets the criteria, is inexpensive, and is readily available. However, other ceramic materials (such as alumina nitride, or silicon nitride) may also be used, as well as glass, dielectric coated metal (for example anodized aluminum and paryline coated materials), silicon (such as an oxidized or dielectric coated silicon wafer), Kapton (Polyimide) flex material, Printed Circuit Board (PCB) material.

Figure 9:
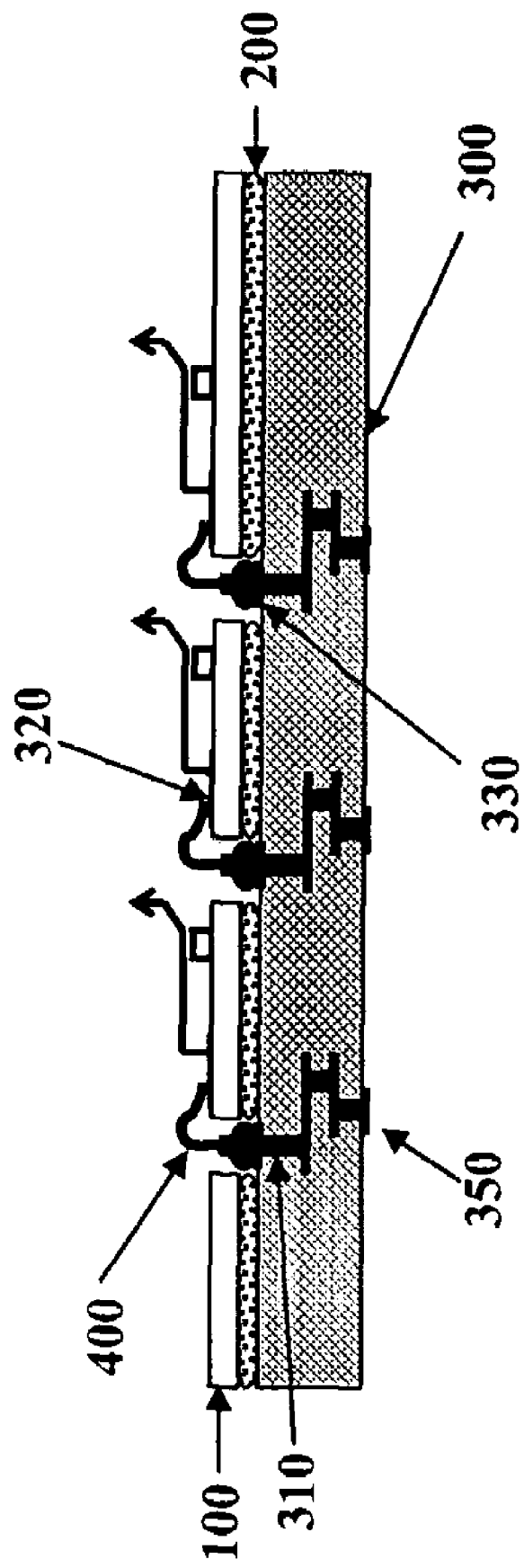
FIG. 9 illustrates a side view of an embodiment of the present invention.
Figure 10:
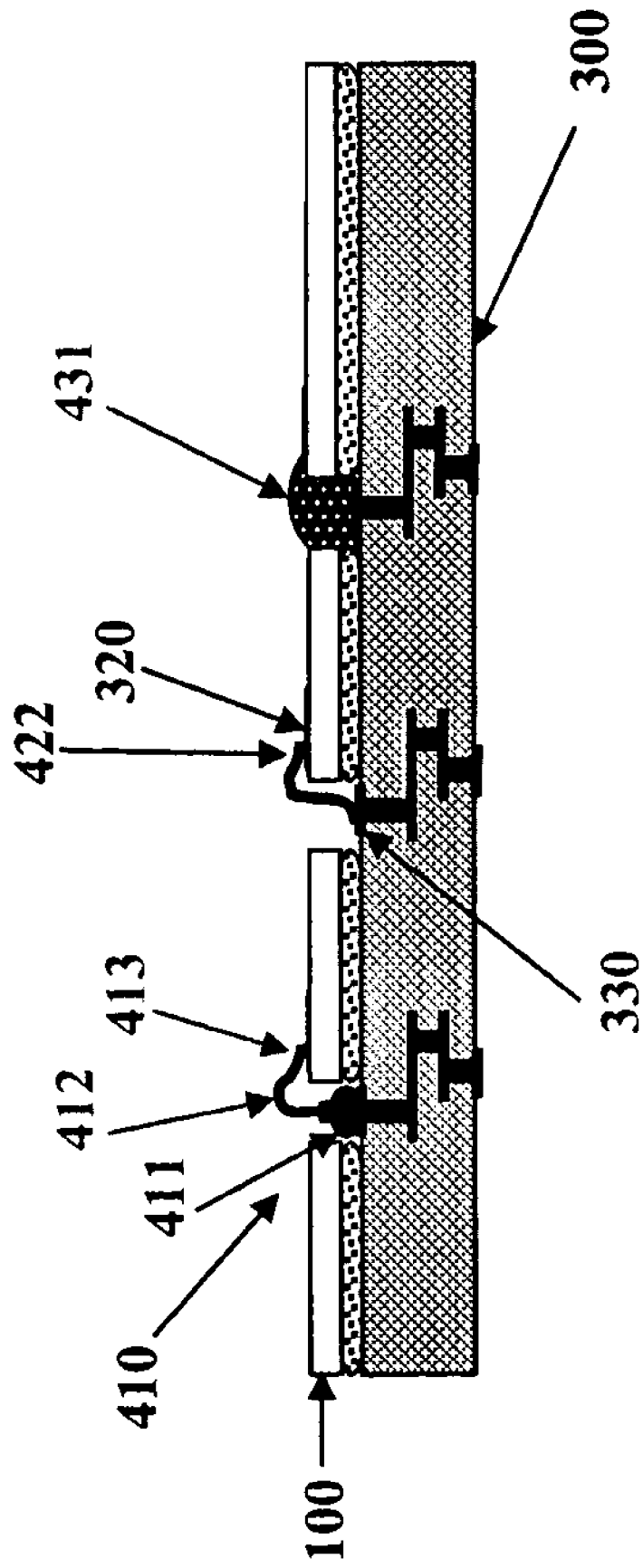
FIG. 10 illustrates a side view of an embodiment of the present invention employing various methods of bonding terminals on the probe contactor substrate to the terminals on the space transformer.

Upon the contactor substrate 100, the MEMS structures 110 (also referred to as the "probe contactors") are built. These MEMS structures are contactors which are specifically built to withstand the stresses and environment of testing semiconductors. These structures may be torsional spring contactors as described by U.S. Pat. No. 6,771,084 to DiStefano or U.S. patent application Ser. Nos. 11/019,912, 11/102, 982, 11/194,801, and 11/194,720, all of which are assigned to Touchdown Technologies, Inc., and the disclosures of which are hereby incorporated by reference. The contactors 10 may also be of the cantilever type contactor such as those produced by Form Factor, Inc. and others. The contactors may also be inflexible type contactors (for example see U.S. Pat. No. 6,891,360 assigned to IBM) which are often used in testing bumped wafers. The contactors 110 may be assembled to the contactor substrate 100, or they may be built directly on the contactor substrate as described in U.S. patent application Ser. Nos. 11/019,912 and 11/102,982. When contactors 110 are built directly on the contactor substrate 100, in accordance with the above mentioned applications, they are often built using processes which involve sacrificial metal and removable photoresist. This combination of substances (a solution) is denoted by reference figure 120. The base of the probe contactor 110 is usually connected via a metal trace to a terminal 320 on the probe contactor substrate 100 as can be seen in FIGS. 9 and 10. This allows for the tips of the probe contactors to have a finer pitch, while allowing the elements to which the probe contactors are electrically connected to have a larger pitch and provides the electrical path to the vias or substrate terminals. Any technique commonly know in the art may be used to form the trace and the terminal including thick film printing, thin film deposition, etching, and plating. If the probe contactor substrate 100 is polyimide flex (or some other flex such as Liquid Crystal Polymer) or PCB material, then the techniques commonly used in relevant printed wiring board manufacturing may be employed, including so-called "additive" processes where traces and terminals are electroplated up on a thin laminated metal seed layer, and "subtractive" processes where a laminated metal layer is etched to produce the trace and terminal.

Figure 2:
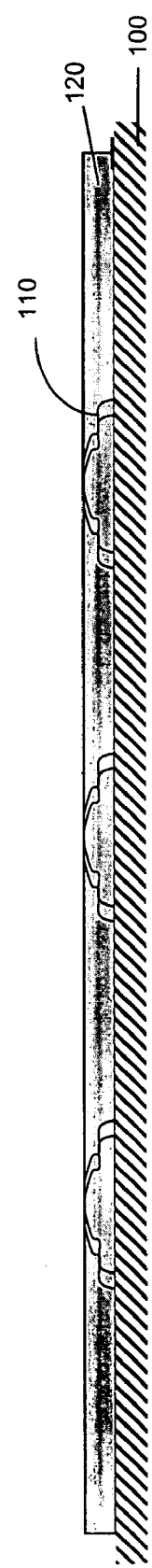

In one embodiment, after the contactors 110 are formed on the contactor substrate 100, the backside of the contactor substrate is then machined and planarized down to its desired thickness as shown in FIG. 2. For example, in the case of a contactor substrate 100 which is made from alumina, the substrate may be machined and planarized to a thickness of 6 mils-80 mils (approximately 0.15 mm-2.0 mm). After the contactor substrate 100 has been machined and planarized, troughs 130 may be etched away between the islands 140 of probe contactors 110 as shown in FIG. 3, usually using a process of photo patterning and then etching. (Alternately, the entire sacrificial material 120 may be etched away and replaced with a material (such as a thermoplastic or wax potting compound) that can be easily laser cut and later removed (still indicated by 120). In still yet another embodiment, the entire sacrificial material 120 may be removed, and not replaced with another material. In both alternative forms, the troughs 130 are not formed, and the process proceeds directly to the next step of forming the slots 150 as shown in FIG. 4).

Figure 14:
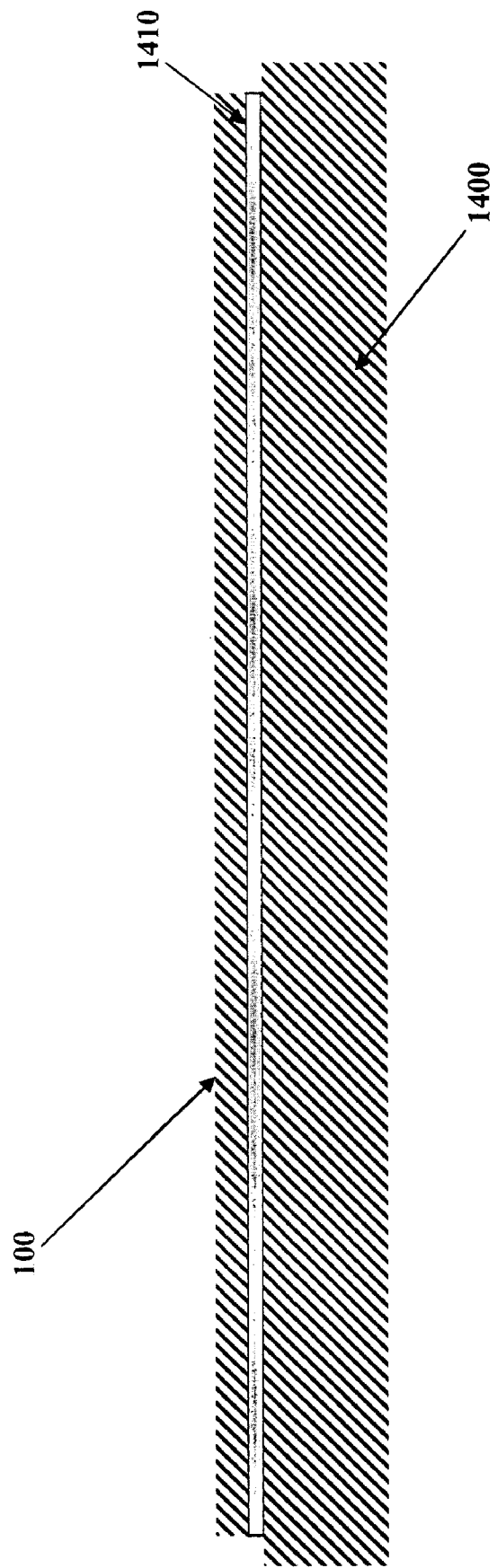
FIGS. 14-16 illustrate an alternative process for forming an embodiment of the present invention.
Figure 15:
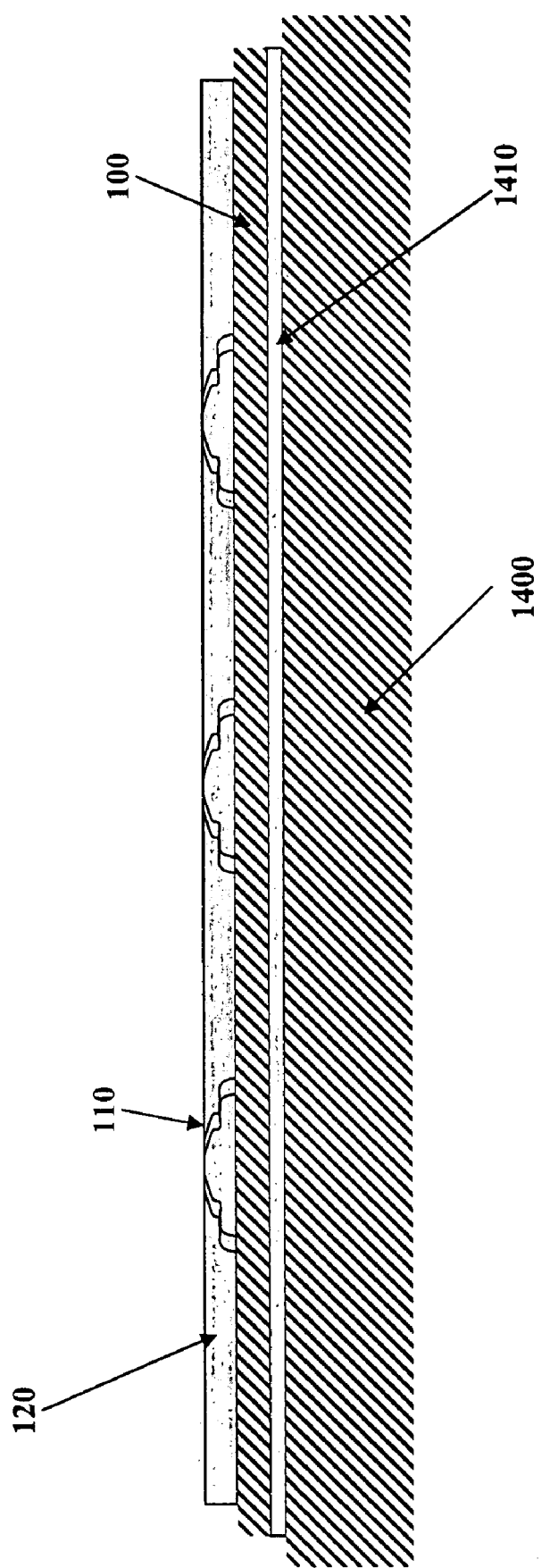
Figure 16:
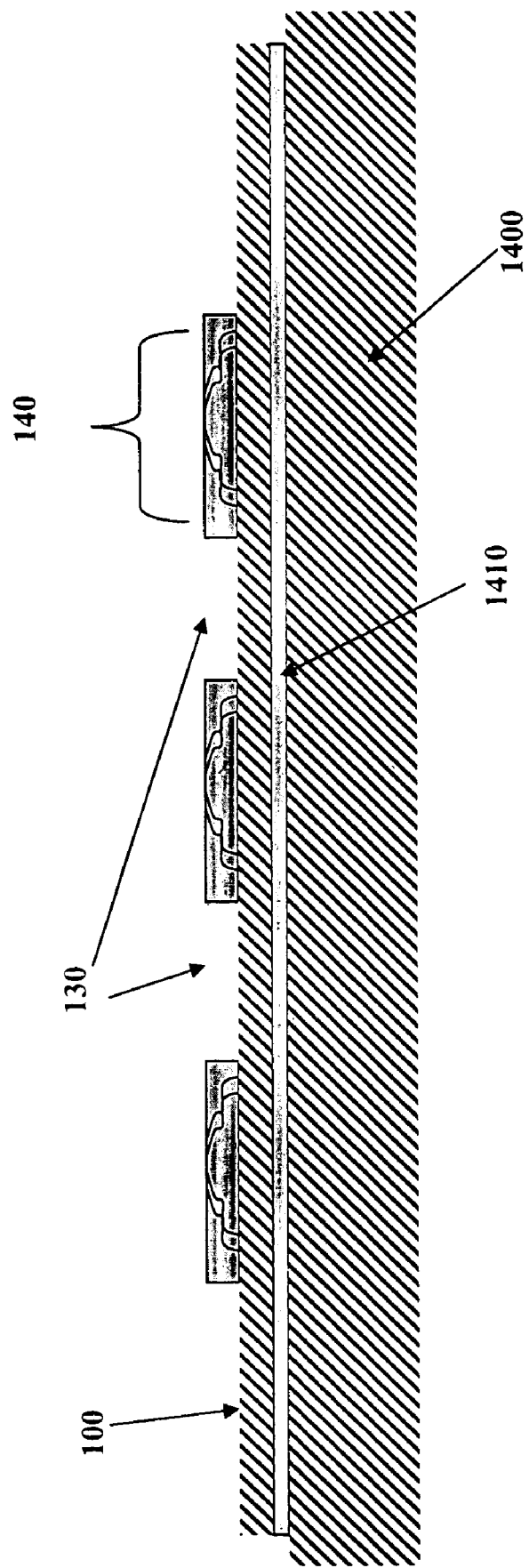

The process of forming the present invention, up to this point, may be alternatively accomplished by the method shown in FIGS. 14-16, without departing from the spirit of the invention. In FIG. 14, the substrate 100 which has already been planarized to its desired thickness is bonded to a sacrificial substrate 1400 using a solder, thermoplastic or other suitable material 1410 prior to building the probe contactors on the contactor substrate. For example, a contactor substrate 100 formed of planarized 1 mm alumina may be soldered to a 5 mm thick alumina sacrificial substrate 1400 using a fluxless solder 1410 such as 90/10 Sn—Au (217C). The primary purpose in utilizing a sacrificial substrate 1400 is to add strength to the probe contactor substrate 100 during the lithographic processes of building the probe contactors 110. The probe contactors 110 are then built onto the probe contactor substrate 100 as shown in FIG. 15. After the probe contactors 110 have been built onto the substrate 100, the troughs 130 are etched away between the islands 140 of the probe contacts 110 as above (FIG. 16). The sacrificial substrate 1400 may then be removed, resulting in the same structure as FIG. 3.

Figure 11:
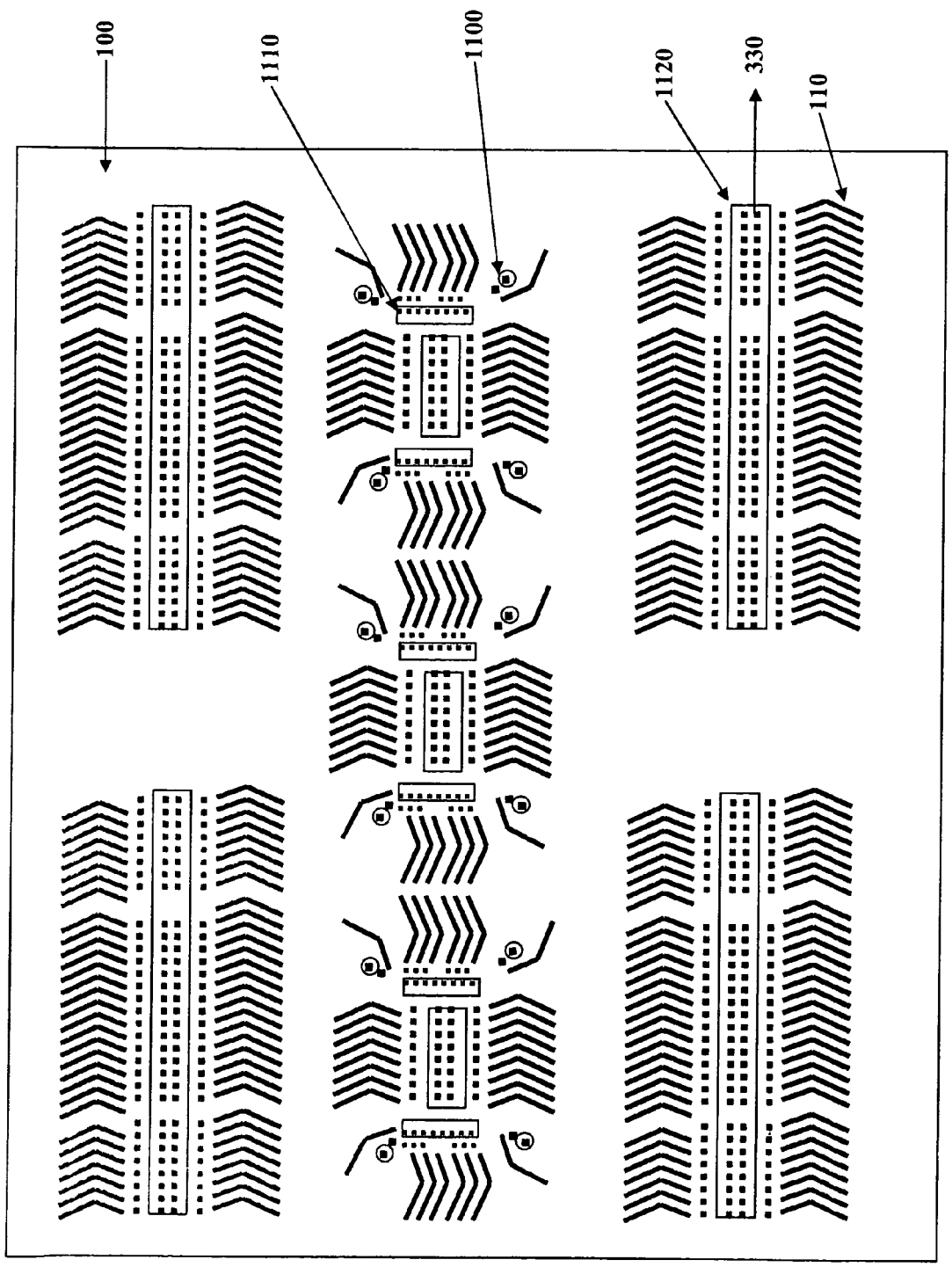
FIG. 11 illustrates a top view of an embodiment of the present invention identifying the vertical and horizontal slots and holes which may be formed in the probe contactor substrate.

Through the troughs 130, slots 150 are formed in the contactor substrate 100, as shown in FIG. 4 (These slots 150 may be vertical slots 1110, horizontal slots 1120, or holes 1100 as shown in FIG. 11. The slots allow the probe contactor substrate 100 to remain a single substrate, as opposed to several individual substrates which will need to be individually assembled to the space transformer 300 in a manner that maintains very close tolerance alignment between the individual probe contactor substrates. These slots 150 will be used to connect the terminals 320 on the probe contactor substrate 100 to bond pads 330 on the space transformer 300. These slots 150 are preferably laser drilled if the contactor substrate 100 is ceramic. Alternatively the slots 150 may be formed by abrasive jet processing, mechanical drilling using machine tools, or green formed by punching or drilling prior to firing as known in the art. If the substrate 100 is silicon, the slots 150 maybe formed by chemical etching (wet chemical or xenon difluoride as is commonly practiced in the art of Silicon micromachining) or plasma etching. If the substrate 100 is metal, the slots 150 may be drilled by mechanical means, by chemical etching, by Electric Discharge Machining (EDM) or any other suitable machining technique. Once the slots 150 have been formed, the probe contactors 110 may be released from their sacrificial support 120, as shown in FIG. 5. (Alternatively, the probe contactor springs could be individually attached, or bonded in groups to the probe contactor substrate (as is done by MJC and Form Factor respectively), i.e., the probe contactor springs are not built directly on the probe contactor substrate itself as taught above. In this case, the slots 150 could be cut either before or after the springs are attached to the substrate, but the remainder of the process flow would be unchanged). The dimensions of the slots are determined by the probe layout, and a width of approximately 0.5 mm to 2 mm may be optimal for many applications. The actual width of the slots will be determined by several factors including substrate thickness, bond technique employed, and DUT arrangement. Accordingly, the actual slot width could fall outside of the above range without falling outside the scope of the invention.

In another embodiment (not shown), the probe contactors 110 may be built on a contactor substrate 100 which has pre-drilled slots 150 which have been filled with a sacrificial material, preferably the same sacrificial metal in the solution 120 which is used when forming the probe contactors 110. When the probe contactors 110 are released from their solution 120 of sacrificial metal and photoresist, the sacrificial metal which has was used to fill the pre-drilled slots 150 is also removed, resulting in the structure shown in FIG. 5. The formation of the remainder of the probe card assembly is the same as the other embodiments.

Figure 6:
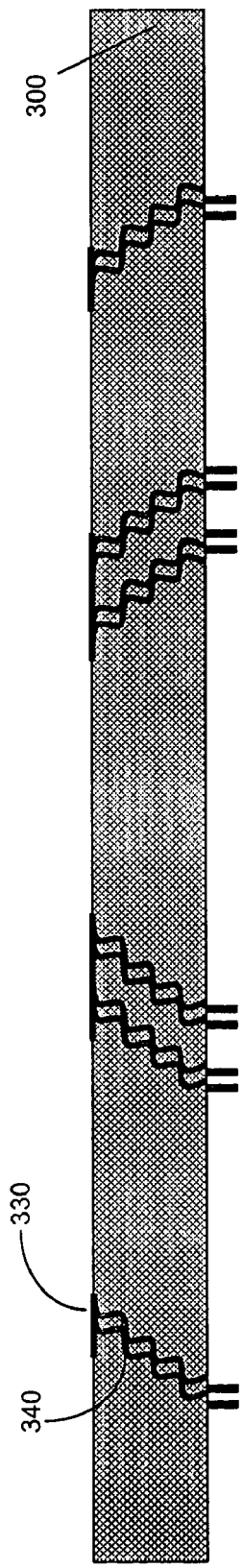

While the process of forming the probe head is ongoing (that is, attaching the probe contactors 110 to the substrate 100, forming the troughs 130, the slots 150, and releasing the probe contactors), the space transformer 300 may also be formed, as shown in FIG. 6. By forming both the space transformer and the probe head at the same time (in parallel), the time required to form the probe head and hence the probe card assembly can be significantly decreased. For example in at least one prior art example, the space transformer is formed first, requiring approximately 21 days. Once the space transformer is formed, the probes are fabricated on top of the space transformer requiring approximately another 21 days or more (See FIG. 12). However, in the present invention, by decoupling the space transformer and the probe contactor substrate, the space transformer and the probe contactor substrate may be formed at the same time (See FIG. 13). This manufacturing process can reduce the time required to manufacture the entire probe card assembly by as much as 50%.

The space transformer 300 may be a printed wiring board or an interconnect substrate. It is preferably a ceramic wiring board such as a Low Temperature Co-fired Ceramic (LTCC) or a High Temperature Co-Fired Ceramic (HTCC) board as these materials are well thermally matched to ceramic and silicon in terms of thermal expansion coefficient. Other options include organic wiring substrates, PCB substrates, Flex substrates, etc. The space transformer material is selected primarily for multi-layer wiring capability, cost, and manufacturability without undue regard to surface finish, surface integrity or compatibility with MEMS processes. Such a material is DuPont 951, Dupont 943, or LTCC tape. Forming the space transformer often involves the production of multilayer circuits from ceramic substrate tapes or sheets. Via holes are punched in the substrates, the via holes are filled with conductive paste, and conductive, dielectric, and resistive pastes are optionally applied in wiring patterns on the surface of each sheet or tape as needed, and then the sheets are laminated-together and fired (often in a precisely controlled oven or kiln) in one step. The resulting product is a monolithic space transformer or multi-layer wiring board structure. A typical LTCC space transformer consists of multiple dielectric layers; screen-printed or photo-imaged low-loss conductors; embedded inductors, resistors and capacitors; and vias for interconnecting the multiple layers. A multi-layer wiring board (which an LTCC space transformer is, may also have impedance control and crosstalk shielding measures such as strip lines and coplanar waveguides. Additionally, multiple layers may form a wiring network within the substrate connecting one bond pad 330 to another bond pad (or multiple bond pads). The space transformer may also include ground planes and power planes as is known in the art. Electronic components such as capacitors, active switches or integrated circuits may be attached on either surface of the space transformer or in pockets formed in the space transformer circuit (as is commonly known in the art of electronic packaging using ceramic wiring substrates). Each layer can be inspected before lamination and firing to allow opportunity to replace damaged circuits and improve yield. Since the ceramic materials used in LTCC designs are inherently very temperature stable, the need to compensate for variations in temperature is greatly reduced.

Figure 7:
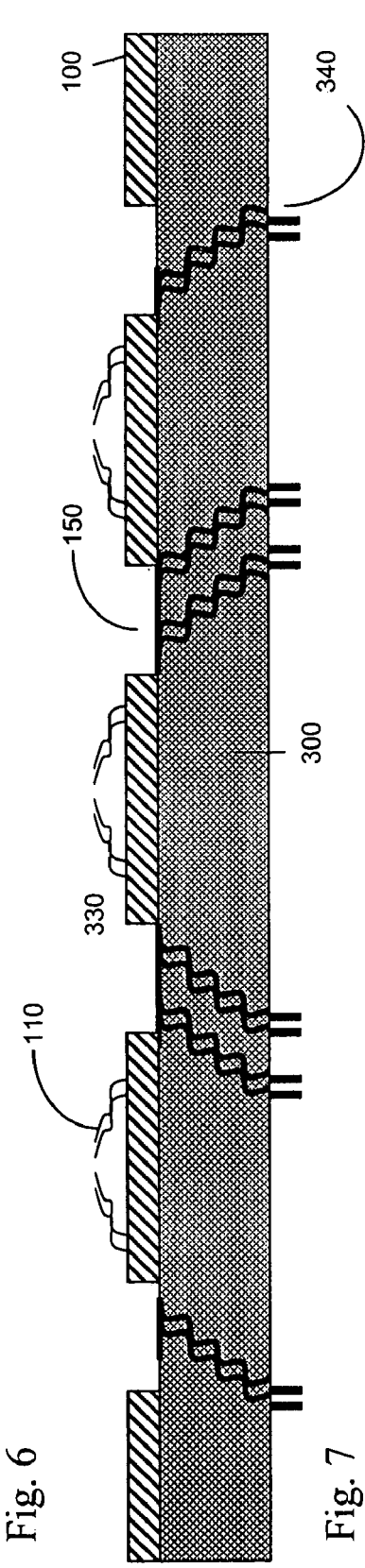

As shown in FIG. 6, the top of the space transformer includes bond pads 330. The bond pads may be formed directly on an electrical via 340 that conducts the electrical signal through the space transformer 300, from the top to the bottom, or alternatively, the bond pad 330 may be formed over the space transformer's surface and connected to the via 340 by a metal trace (not shown). The bond pads 330 are located on the space transformer in positions that align to the slots 150 formed in the contactor substrate 100 as shown in FIG. 7. The bond pad 330 is preferably a wire bondable pad such as a gold thick film material or electroplated gold. Other options include aluminum or any other conductive bondable bond pad suitable for wire bonding or conductive adhesive bonding.

Figure 8:
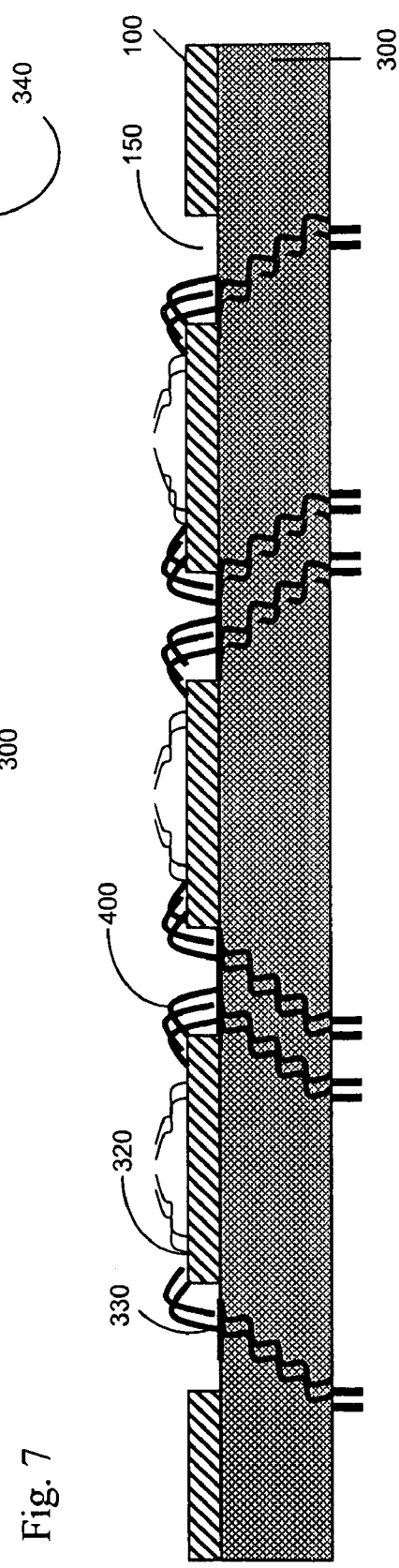

After the space transformer 300 and the probe contactor substrate 100 are joined together, the bond pads 330 are electrically connected to the terminals 320 by a bond interconnect 400 as shown in FIG. 8. The bond interconnect 400 may be any number of interconnects that electrically connect the terminals 320 to the bond pads 330.

FIG. 10 illustrates several bond interconnects 400. In one embodiment, the bond interconnect 400 is a gold wire that has been attached using the thermosonic ball bonding technique in which a gold wire ball bonder 411 is used to attach a gold wire 412 from a bond pad 330 to a terminal 320 through the slot 150. The gold ball 411 may be placed on either the terminal or the bond pad, but it is preferably placed on the bond pad 330 as this will minimize the height of the gold wire 412 above the surface of the contactor substrate 100. The gold wire's height (often formed with a slight loop) must be below the tip of the probe contactor 110 so as to avoid shorting to the DUT during use. One end of the gold wire 412 is attached to the gold ball 410, while the other end of the wire, often called the "heel") is attached to the terminal 320. In another embodiment, the terminal and the bond pad are attached by a wedge bonded wire. In wedge bonding, there is no ball. Instead, the wire 412 (typically Aluminum but gold is also often used) is bonded directly to the terminal 320 and the bond pad 330. In still another embodiment, an adhesive or solder paste 431 is used to connect the terminal 320 and the bond pad 330. In the adhesive embodiment, the adhesive is cured to fix the connection. In the solder embodiment, the entire assembly is heated to the solder reflow temperature and the solder is applied. The entire assembly is then cooled, and cleaned to remove residual flux if necessary.

The bottom surface of the space transformer 300 is adapted for connection to a probe card or PCB or another interposer/space transformer depending on design requirements. Accordingly, the bottom surface of the space transformer 300 has electrical terminals 350 (as shown in FIG. 9) which may be wire bondable, bumpable, adapted for contact by spring interconnects such as those manufactured by Form Factor, Inc. known as MicroSprings™ or spring pins made by Everett Charles Corp. under the trade name PogoPin™, or adapted for connection to a lateral interposer as disclosed in U.S. patent application Ser. No. 11/226,568, assigned to Touchdown Technologies, Inc., the disclosure of which is incorporated by reference.

Some probe card architectures employ an interposer 1700 between the wiring board and the probe head (100, 300) that imparts a very small force on the probe head (100, 300). In this architecture, it is desirable to have a probe head with tight planarity. In such cases it is required that the attachment structure 200 is compliant to absorb any expansion differences in the probe contactor substrate 100 and the space transformer substrate 300 so that the probe head (100, 300) planarity does not change with operating temperature. Preferably, the probe contactor substrate 100 and the space transformer substrate 300 are joined together by an attachment structure 200 such as a compliant adhesive chosen with suitable modulus to account for the thermal mismatch between the space transformer 300 and probe contactor substrate 100. Some suitable options for such an attachment structure 200 may include adhesive polymers such as silicone, elastomers, polyimides, BCB (benzo-cyclo-butene), or hard materials such as solder. Thermally compliant mechanical attachments between the space transformer 300 and the probe contactor substrate 100, such as screws and clips, are also possible. If adhesive is used, it can be dispensed in place, screen printed, or any other means commonly known in the art. B-stage preform may also be used. If solder is used, it may be screen printed as a paste, applied as a preform, or it may be deposited (evaporated or electroplated) prior to reflow (melting to attach the space transformer 300 and the probe contactor substrate 100). If adhesives are used, the elastic modulus of the adhesive, the dispense pattern and coverage area and the adhesive bond line thickness can be engineered to absorb any thermal expansion mismatch between the space transformer substrate 300 and the contactor substrate 100. Without such expansion absorption, the probe head (100, 300) could have a thermally sensitive curvature. This thermal mismatch curvature effect must be considered regardless of the attachment method used.

Spacers (not shown) may be formed between the probe substrate 100 and the space transformer 300 in order to accurately control the adhesive bond line thickness if adhesive is used as the attachment structure 200. The spacers are preferably electroplated on the top surface of the space transformer. Once attached to the space transformer, the spacers can be machined so that their top surfaces lie in a plane. This machining operation guarantees that the bottom of the probe substrate has a flat planar surface to bond against, thus ensuring that the probe tips lie in a plane even when the surface of the space transformer is imperfect and not flat. Alternately, the spacers can be applied to the bottom of the probe substrate.

Figure 17:
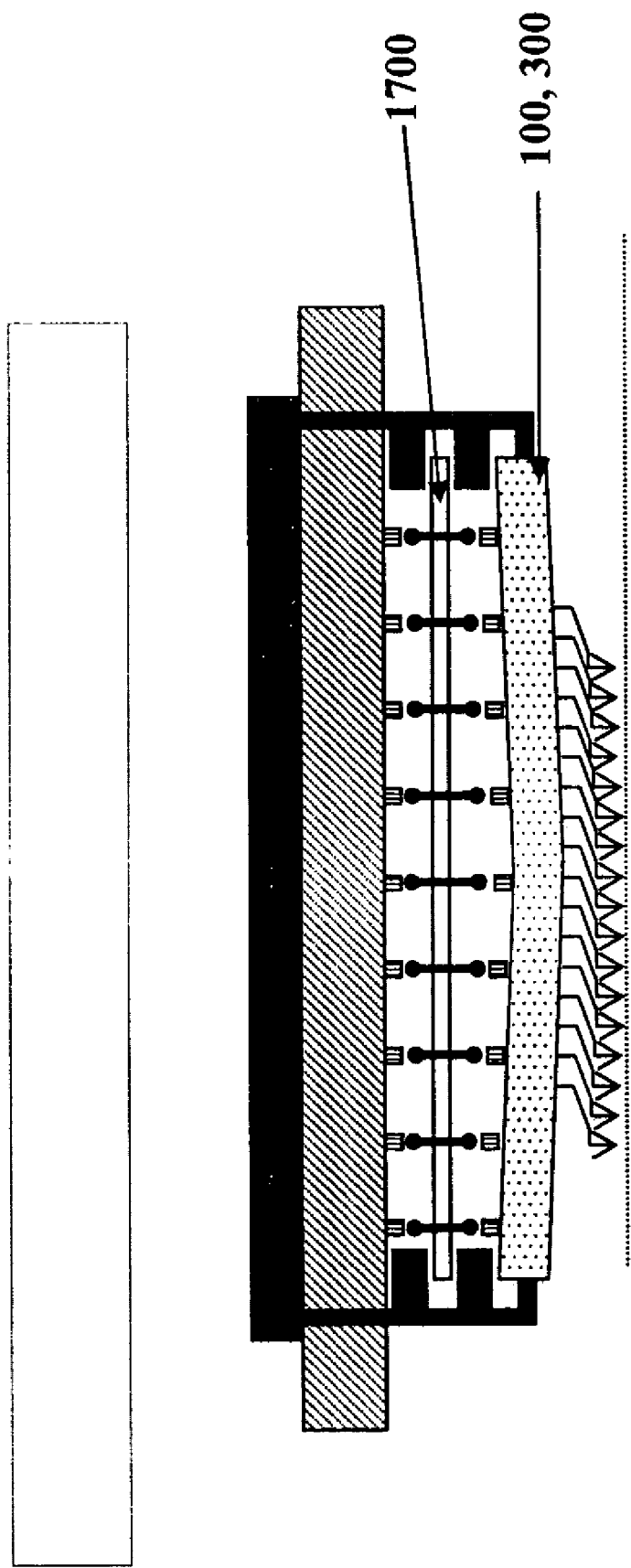
FIG. 17 illustrates the effect on planarity of the probe head when a net force interposer is used in the probe card architecture.

Other probe card architectures employ an interposer that imparts a substantial force between the PCB and the probe head (100, 300). This results in a planarity of the probe head (100, 300) that is not optimal as shown in FIG. 17. Manufactures must thus find other ways to restore the planarity of the probe head (100, 300) when such an interposer 1700 is used. One such method is to bond support posts to the backside of probe head and pull the probe head into planarity as described by a patent publication number 20080007281, "Method of Forming a Probe Card Assembly," issued to Touchdown Technologies, Inc.

Figure 18:
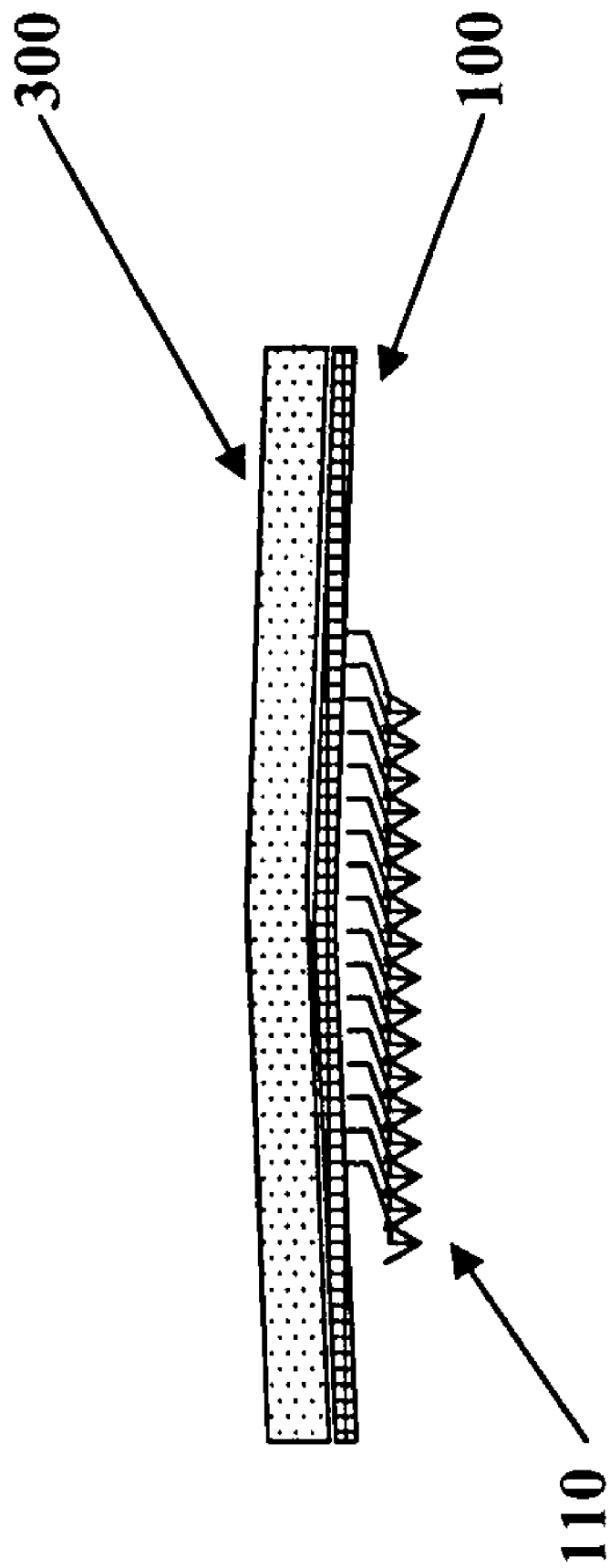
FIG. 18 illustrates a pre-bowed probe head according to an embodiment of the present invention.
Figure 19:
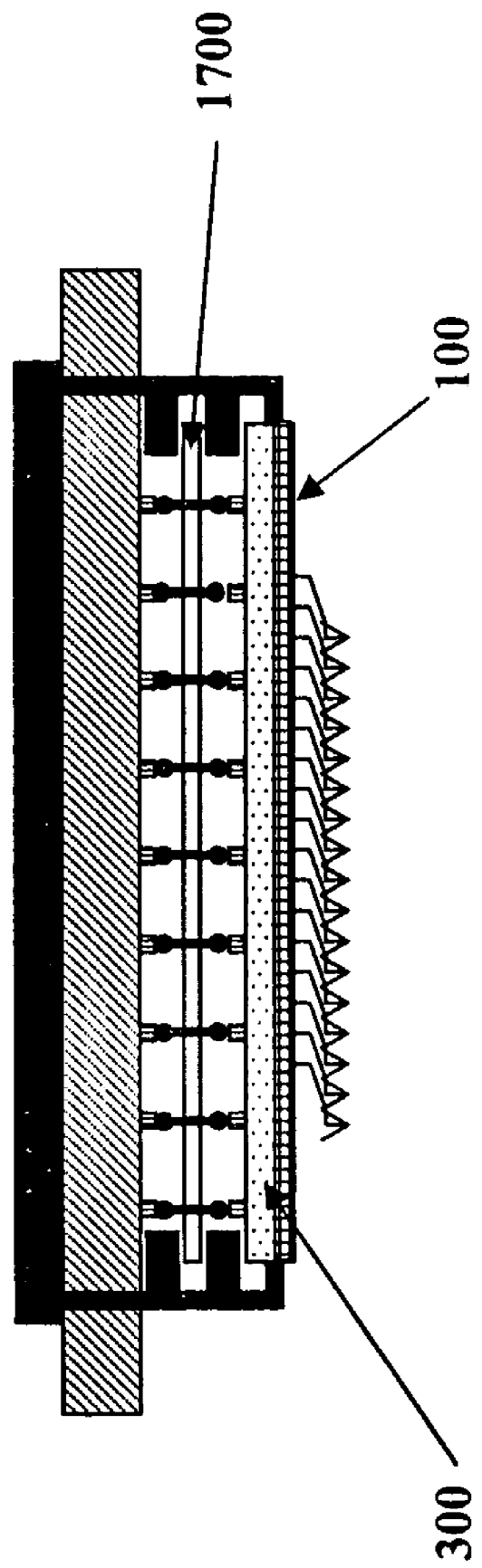
FIG. 19 illustrates the effect on planarity of a net force interposer on a pre-bowed probe head after assembly.

Another method of attaining planarity in an architecture employing a net force interposer, is to utilize a "pre-bowed" probe head (100, 300) as described below as part of the present invention. Using a "pre-bowed" probe head restores the planarity of the probe head (100, 300) after it has been assembled to a net-force interposer 1700. One method to induce a "pre-bow" on the probe head (100, 300) is to select a probe contactor substrate 100 with a higher Coefficient of Thermal Expansion (C.T.E) than the space transformer substrate 300, and to rigidly bond the space transformer substrate 300 to the probe contactor substrate 100 using solder, epoxy, etc at a temperature higher than the probe head operating temperature, as shown in FIG. 18. Several variables such as modulus of adhesive, bond area, bond-line thickness, bonding temperature, modulus of the probe contactor substrate 100, the C.T.E. of probe contactor substrate 100 and the space transformer 300, can be optimized to tune in the desired pre-bow. It is important to note that the probe head pre-bow in the un-assembled state induced by this method keeps changing with temperature. Since the probe card (100, 300) is usually specified to operate in a wide temperature range, it is necessary that the bonding conditions are chosen to balance the interposer 1700 force at the probe card's highest operating temperature and then a rigid pin used on the backside of the probe head (100, 300) provides rigidity to the assembly. This will result in a pre-bowed probe head (100, 300) which will balance out the net force of the interposer 1700, as shown in FIG. 19.

Figure 20:
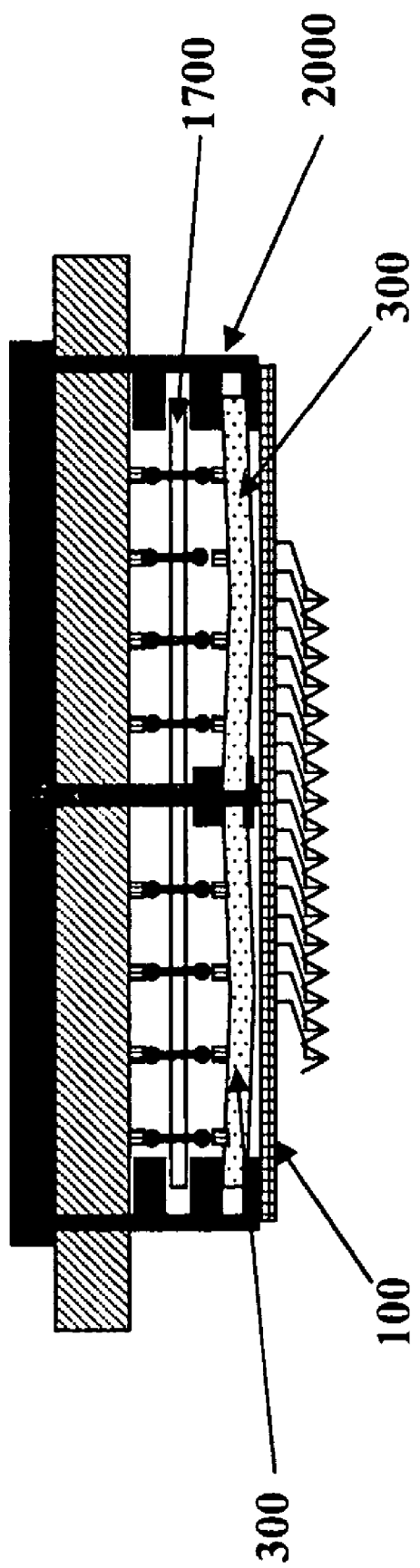
FIG. 20 illustrates a probe card assembly having tiled space transformer substrates and a single probe contactor substrate according to an embodiment of the present invention.

Another embodiment of this invention includes attaching multiple space transformer substrates 300 to a single probe contactor substrate 100, or vice-versa, to meet the complex size and planarity requirements of advanced probe heads. FIG. 20 illustrates a plurality of space transformer substrates 300 attached to a monolithic probe contactor substrate 100. One of the common prior art methods to build a probe card (100, 300) with large probing area is to tile individual probeheads (a plurality of single probe contactor substrates 100 attached to a plurality of single space transformer substrates 300 on 1 to 1 ratio) by mechanical means. However this approach is complex given the probe card spec and the high number of degrees of freedom in tiling. Tiling can be made simpler if one of the two, probe contactor 100 or space transformer substrates 300 is monolithic since it reduces the degrees of freedom considerably.

In one embodiment where a monolithic probe contactor substrate 100 is chosen, the space transformer tiles 300 can be directly attached to the backside of the probe contactor substrate 100 in such a way that the interconnect pads on the two substrates align to each other for interconnections (not shown). In another embodiment, as shown in FIG. 20, the probe contactor substrate 100 can be mounted on a mechanically rigid frame 2000 in which the space transformer tiles 300 are assembled. In this case the frame 2000 provides the added rigidity for the probe head (100, 300), which facilitates another way of negating the interposer 1700 forces on the probe head (100, 300). The number of space transformer tiles 300 can be as few as two and as many as dozens. The number space transformer tiles 300 is often dictated by the electrical interconnect specifications in the space transformer to meet the probe card design requirements.

In another embodiment the space transformer tiles 300 can be bonded together using adhesives such as epoxies, polyimide, etc or also by brazing or soldering if the space transformer material permits. It may be favorable to tile with polyimide if the space transformer 300 material is organic. If the space transformer 300 material is Low Temperature Co-fired Ceramic or High temperature Co-fired Ceramic it may be favorable to tile with the parent material slurry paste and fire again to bond them together. In such a case a monolithic space transformer substrate 300 can be realized.

In yet another embodiment where a monolithic slotted probe-contactor substrate 100 (as discussed above utilizing slots 150) is used, the space transformer substrates 300 or tiles can be directly assembled or flip chip bonded onto the printed circuit board and then the probe contactor substrate 100 bonded or attached on top of the tiles. Mechanical frame or supports can be used to rigidize the probe contactor substrate so there is no flexing of the substrate during probe card touchdowns.

In another embodiment where a monolithic space transformer substrate 300 is used, probe contactor substrates 100 or tiles that already have slots 150 in them can be assembled onto it. Alignment in the X, Y directions and theta can be accomplished with optical alignment tools. Alignment in Z direction can be accomplished by controlling the parallelism and thickness of the probe contactor tiles as described in U.S. Pat. No. 7,180,316 owned by Touchdown Technologies, Inc.

Figure 21:
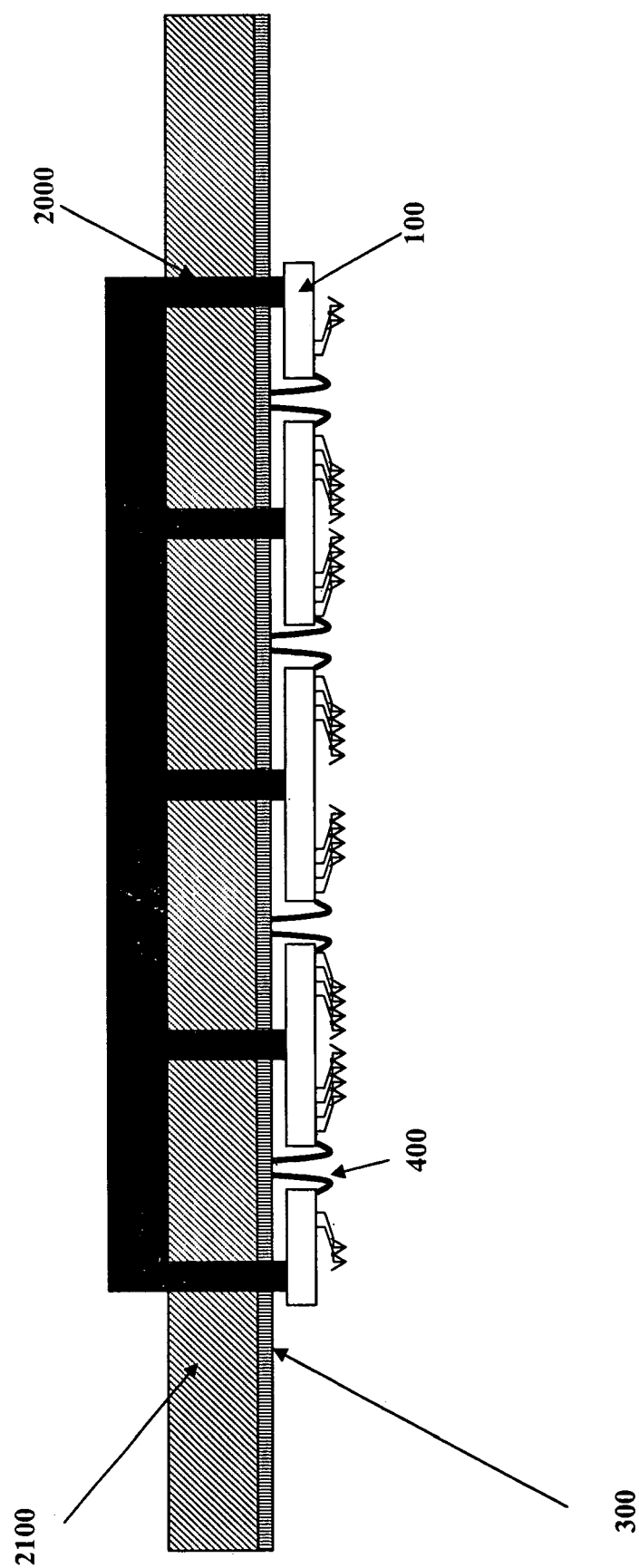
FIG. 21 illustrates a probe card assembly having an integrated PCB and space transformer according to an embodiment of the present invention.

In another embodiment the space transformer 300 is integrated into the PCB 2100, using High Density Interconnnect (HDI), as shown in FIG. 21. The HDI technology is adapted to function as both the interposer and the space transformer. A monolithic (or tiled) probe contactor substrate 100 is attached to the mechanical frame 2000, and the bond interconnects 400 are formed directly to the integrated PCB/HDI space transformer 300.

While particular elements, embodiments, and applications of the present invention have been shown and described, it is understood that the invention is not limited thereto since modifications may be made by those skilled in the art; particularly in light of the foregoing teaching. It is therefore contemplated by the appended claims to cover such modifications and incorporate those features which come within the spirit and scope of the invention.

What is claimed is:

1. A probe head subassembly comprising:
   a probe head comprising:
      at least one probe contactor substrate having at least one hole that passes through the probe contactor substrate;
      at least one probe contactor, the probe contactor being coupled to a top side of the probe contactor substrate and electrically coupled to a terminal also coupled to the top side of the probe contactor substrate;
   a space transformer coupled to the probe contactor substrate and fabricated concurrently with fabrication of the probe head, the space transformer having at least one bond pad coupled to a top side of the space transformer, the bond pad electrically coupled to a via, the via providing electrical communication from the top side of the space transformer to a bottom side of the space transformer; and a bond interconnect which electrically connects the at least one bond pad to the terminal through the hole in the probe contractor substrate.

2. The probe head subassembly of claim 1, wherein the bond interconnect is a wire bond.

3. The probe head subassembly of claim 1, wherein the probe contactor is lithographically formed on the probe contractor substrate.

4. The probe head subassembly of claim 1, wherein the probe contactor substrate is ceramic.

5. The probe head subassembly of claim 1, further including a plurality of terminals coupled to the top side of the probe contactor substrate, and a plurality of bond pads coupled to the top side of the space transformer and wherein each bond pad of the plurality of bond pads is connected to a respective terminal of the plurality of terminals through the hole in the probe contractor substrate.

6. The probe head subassembly of claim 1, wherein the bond interconnect is a conductive adhesive.

7. The probe head subassembly of claim 1, wherein the space transformer is a multi-layer wiring board.

8. A method of forming a probe head assembly comprising:
  forming a probe head, the probe head comprising a plurality of probe contactors and a probe contactor substrate, wherein forming the probe head includes:
    forming the plurality of probe contactors on a top side of the probe contactor substrate;
    forming a hole which passes completely through the top side of the probe contactor substrate to a bottom side of the probe contactor substrate; and
  forming a space transformer concurrently with forming the probe head, the space transformer including a plurality of bond pads;
  electrically coupling the plurality of bond pads to the plurality of probe contactors on the probe contactor substrate through the hole in the probe contactor substrate.

9. The method of claim 8, wherein the probe contactors are lithographically formed on the probe contactor substrate.

10. The method of claim 8, wherein the space transformer is a multi-layer wiring board.

11. The method of claim 8, further comprising coupling the space transformer to the probe contactor substrate.

12. The method of claim 8, further comprising machining the probe contactor substrate to a desired thickness after the plurality of probe contactors have been formed on the probe contactor substrate.

13. The method of claim 8, wherein each of the plurality of probe contactors are electrically coupled to a plurality of respective terminals, and each of the plurality of respective terminals are electrically coupled to a respective bond pad of the plurality of bond pads.

14. The method of claim 8, wherein forming a hole comprises machining the hole through the probe contactor substrate after the plurality of probe contactors have been formed on the probe contactor substrate.

15. A method of forming a probe head assembly comprising:
  forming a probe head, the probe head comprising a plurality of probe contactors, a plurality of terminals, and a probe contactor substrate, wherein forming the probe head includes:
    lithographically forming the plurality of probe contactors in a solution on a top side of the probe contactor substrate, the plurality of probe contactors being formed into at least two groups separated by a distance of at least 0.5 mm, each of the plurality of probe contactors being electrically coupled to a respective terminal of a plurality of terminals;
    machining a bottom side of the probe contactor substrate such that the probe contactor substrate has a desired thickness;
    etching at least one trough in the solution of the probe contactors to form an opening between two groups of probes;
    forming a slot in the probe contact or substrate in approximately the same location as the trough;
    releasing the plurality of probe contactors from the solution;
  forming a space transformer concurrently with forming the probe head, the space transformer having a plurality of bond pads, wherein forming the space transformer includes forming the plurality of bond pads on a top side of a space transformer;
  coupling the top side of the space transformer to the bottom side of the probe contractor substrate such that the bond pads are accessible through the top side of the probe contactor substrate; and
  electrically coupling the respective terminal of the plurality of terminals to a respective bond pad of the plurality of bond pads.

16. The method of claim 15, wherein the probe contactor substrate is ceramic.

17. The method of claim 15, wherein the space transformer is a multi-layer wiring board.

18. The method of claim 15, wherein a wire bond electrically couples a respective bond pad of the plurality of bond pads to a respective terminal of the plurality of terminals.

19. The method of claim 15, wherein a conductive adhesive electrically couples a respective bond pad of the plurality of bond pads to a respective terminal of the plurality of terminals.

* * * * *

UNITED STATES PATENT AND TRADEMARK OFFICE
CERTIFICATE OF CORRECTION

PATENT NO. : 7,692,436 B2  Page 1 of 1
APPLICATION NO. : 12/077627
DATED : April 6, 2010
INVENTOR(S) : Raffi Garabedian, Salleh Ismail and Lakshmikanth Namburi It is certified that error appears in the above-identified patent and that said Letters Patent is hereby corrected as shown below:

On the bibliography page, in the inventor section (75), "Lakshmikanth Namburi, Duarte, CA (US)" should read --Lakshmikanth Namburi, Duarte CA (IN)--.

Column 5, line 47, "material 1410" should read --material 1410,--.

Column 6, line 40 "which has was used" should read --which was used--.

Signed and Sealed this

Eighth Day of June, 2010

David J. Kappos
*Director of the United States Patent and Trademark Office*